(12) United States Patent
Wayman (10) Patent No.: US 8,291,965 B2
(45) Date of Patent: Oct. 23, 2012

(54) HEAT SINK WITH ANGLED FINS

(75) Inventor: Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 1218 days.

(21) Appl. No.: 11/735,582

(22) Filed: Apr. 16, 2007

(65) Prior Publication Data

US 2008/0236791 A1    Oct. 2, 2008

Related U.S. Application Data (63) Continuation-in-part of application No. 11/692,026, filed on Mar. 27, 2007, now Pat. No. 7,518,863, and a continuation-in-part of application No. 11/691,970, filed on Mar. 27, 2007, now Pat. No. 7,515,420, and a continuation-in-part of application No. 11/692,000, filed on Mar. 27, 2007, now Pat. No. 7,652,880.

(51) Int. Cl.
*F28F 7/00* (2006.01)
*H05K 7/20* (2006.01)

(52) U.S. Cl. ...................... 165/80.3; 165/185

(58) Field of Classification Search ............... 165/80.3, 165/185, 67; 361/697, 703, 709; 257/706; 174/16.3
See application file for complete search history.

(56) References Cited

U.S. PATENT DOCUMENTS

| | | | |
|---|---|---|---|
| 3,242,984 A * | 3/1966 | Jacques Pelce et al. | 165/185 |
| 4,022,272 A * | 5/1977 | Miller | 165/51 |
| 4,459,639 A | 7/1984 | Heil et al. | |
| 4,475,145 A | 10/1984 | Heil et al. | |
| 4,849,858 A | 7/1989 | Grapes et al. | |
| 4,867,235 A | 9/1989 | Grapes et al. | |
| 5,028,989 A | 7/1991 | Naganuma et al. | |
| 5,060,115 A | 10/1991 | Swewll | |
| 5,150,278 A * | 9/1992 | Lynes et al. | 361/690 |
| 5,218,517 A | 6/1993 | Swewll | |
| 5,220,485 A | 6/1993 | Chakrabarti | |
| 5,251,099 A | 10/1993 | Goss et al. | |
| 5,262,587 A | 11/1993 | Moser | |
| 5,284,095 A | 2/1994 | Sabah | |
| 5,398,748 A | 3/1995 | Yamaji et al. | |
| 5,513,071 A * | 4/1996 | LaViolette et al. | 361/703 |
| 6,418,020 B1 * | 7/2002 | Lin | 361/703 |
| 6,480,386 B1 | 11/2002 | Yu | |
| 6,708,757 B2 * | 3/2004 | Hebel et al. | 165/80.3 |
| 6,973,962 B2 * | 12/2005 | Hwang et al. | 165/80.3 |
| 7,046,515 B1 * | 5/2006 | Wyatt et al. | 361/697 |
| 7,721,788 B2 * | 5/2010 | Atarashi et al. | 165/80.2 |
| 2003/0089976 A1 * | 5/2003 | Huang et al. | 257/706 |
| 2003/0094275 A1 * | 5/2003 | Mochizuki et al. | 165/185 |
| 2003/0202327 A1 * | 10/2003 | Chung et al. | 361/697 |
| 2004/0000393 A1 * | 1/2004 | Tavassoli | 165/80.3 |
| 2007/0247809 A1 | 10/2007 | McClure | |

\* cited by examiner

*Primary Examiner* — Tho V Duong
(74) *Attorney, Agent, or Firm* — Fogg & Powers LLC (57) ABSTRACT

A heat sink with angled fins comprising a first set of fins forming air channels, a second set of fins forming air channels and a heat sink base coupled to the first set of fins and the second set of fins. The first set of fins and the second set of fins are separated by a region along a length of the heat sink base. The fins in the first set of fins are at a first angle with respect to the length of the heat sink base and the fins in the second set of fins are at a second angle with respect to the length of the heat sink base.

12 Claims, 12 Drawing Sheets

HEAT SINK WITH ANGLED FINS

CROSS REFERENCE TO RELATED APPLICATIONS

This application claims priority to U.S. patent application Ser. No. 11/692,026 having a title of "MODULARIZED RF BAND COMPONENTS ON REMOVABLE DOORS" (also referred to here as the "'026 Application") filed on Mar. 27, 2007, and U.S. patent application Ser. No. 11/691,970 having a title of "APPARATUS FOR TRANSFERRING HEAT BETWEEN TWO CORNER SURFACES" (also referred to here as the "'970 Application") filed on Mar. 27, 2007, and U.S. patent application Ser. No. 11/692,000 having a title of "COMBINED-NATURAL-AND-FORCED-CONVECTION HEAT SINK" (also referred to here as the "'000 Application") filed on Mar. 27, 2007. The '026 Application, the '970 Application and the '000 Application are hereby incorporated herein by reference.

BACKGROUND

Outdoor enclosures that contain high-power electronic components require a method to dissipate the heat generated by the electronic components. At the same time, it is often required that the electronic components be enclosed in a sealed enclosure to protect the electronic components from the outside environment. Typically, the high power components are attached to a heat sink or enclosed in a chassis attached to heat sinks. The heat from the electronic components travels through the heat sink and the outer surface area of the heat sink creates a natural convection. Many heat sinks include fins to dissipate the heat more efficiently.

The fins form air channels in the heat sinks and are often vertically positioned so the air in the air channels rises to the top of the air channel as it is heated by the fins in the heat sink. Vertical fins also form an easy cross section for a cost effective profile extrusion. In some cases, the high-power electronic components dissipate too much heat for vertically arranged fins to remove all the heat at all times.

SUMMARY

A first aspect of the invention includes a heat sink with angled fins comprising a first set of fins forming air channels and a second set of fins forming air channels and a heat sink base coupled to the first set of fins and the second set of fins. The first set of fins and the second set of fins are separated by a region along a length of the heat sink base. The fins in the first set of fins are at a first angle with respect to the length of the heat sink base and the fins in the second set of fins are at a second angle with respect to the length of the heat sink base.

A second aspect of the present invention includes a method of making a heat sink with angled fins. The method comprises extruding a length of a fin panel, cutting a first portion of the fin panel into first interlocking-parallelogram fin-sections, cutting a second portion of the fin panel into second interlocking-parallelogram fin-sections and interconnecting the first interlocking-parallelogram fin-sections and the second interlocking-parallelogram fin-sections to form the heat sink with angled fins. The fin panel comprises fins extending from a leading edge to a trailing edge. The fins protrude from a surface of a fin panel base. The fin panel has a male edge including a male interlocking feature and a female edge opposing the male edge. The female edge includes a female interlocking feature.

A third aspect of the present invention includes a heat sink with angled fins comprising interlocking fin-sections comprising thermally conductive fins protruding from a thermally conductive fin base. A first set of interlocking fin-sections are operably attached to each other to form a first set of fins in which the fin base has the shape of a first parallelogram. A second set of interlocking fin-sections are operably attached to each other to form a second set of fins in which the fin base has the shape of a second parallelogram. The fins of the first set of fins extend a length that is parallel to a shorter edge of the first parallelogram. The fins of the first set of fins extend a length that is parallel to a shorter edge of the second parallelogram. The heat sink with angled fins also includes a heat sink base coupled to the first set of fins and the second set of fins, a diversion fin centrally positioned along a length of the heat sink base to segment the heat sink base into a first side and a second side. The first side supports the first set of fins and the second side supports the second set of fins. The diversion fin diverts air convected between the fins away from the heat sink base.

DRAWINGS

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide a heat sink that includes angled fins configured to allow air to be pulled in from three sides of the heat sink. Any cross wind is able to be pulled into the three side openings of the heat sink with angled fins to utilize the wind more effectively in removing heat from electronic components attached to the heat sink with angled fins or enclosed in a chassis to which the heat sink with angled fins is attached. A heat sink that has fins running vertically only allows air to be pulled in from the bottom of the heat sink.

Embodiments of the present invention also provide a method of making the heat sink with angled fins by profile extrusion of the fins in the heat sink rather than sand casting or die casting of the fins. There are several advantages in using extrusion to form the fins in the heat sink. Profile extrusion die are less expensive than die cast tools. Profile extrusions can have thinner sections than sand cast parts. Profile extrusions can form fins with an 8:1 typical ratio of fin height to fin spacing, while sand casting can form fins with 1:1 typical ratio of fin height to fin spacing. Thus, the fins formed by profile extrusion can form deeper air channels to provide more efficient heat removal. The profile extrusion can create shapes, such as ribbed fins that sand casting or die casting is unable to accomplish. The cast alloys typically have a higher thermal resistance than extruded alloys of the same material, making the extruded fins more efficient in heat removal. The surface finish of sand cast parts if typically a minimum of 200 micro-inches versus 75 micro-inches for extrusion. Thus, a thinner thermal interface material can be used for extruded parts if no post-processing machining is employed.

Figure 1:
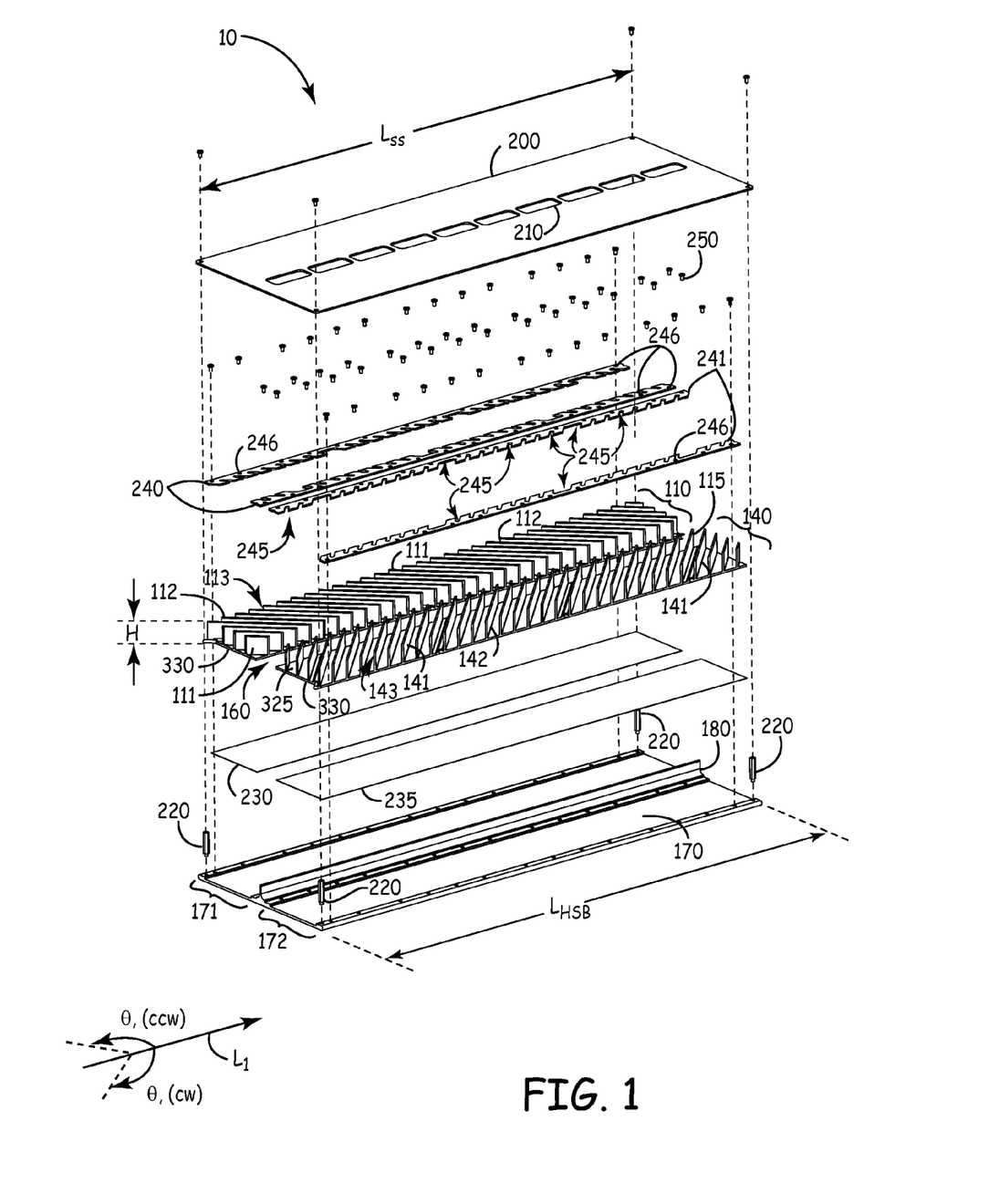
FIG. 1 is an exploded view of components in one embodiment of a heat sink with angled fins.
Figure 2:
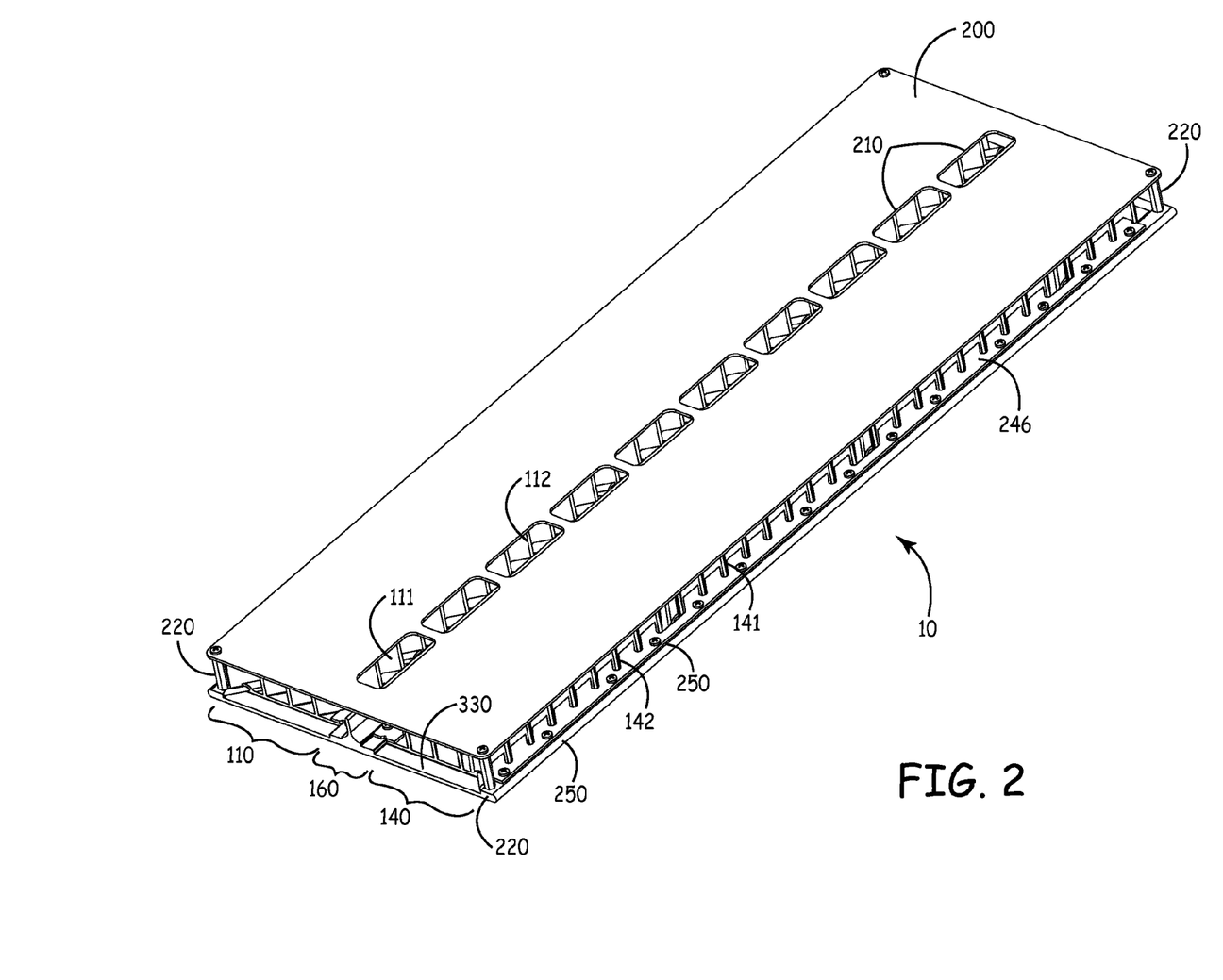
FIG. 2 is an oblique view of the top of the heat sink with angled fins of FIG. 1.

FIG. 1 is an exploded view of components in one embodiment of a heat sink with angled fins 10. FIG. 2 is an oblique view of the top of the heat sink with angled fins 10 of FIG. 1. The components shown in the exploded view of FIG. 1 are all operably positioned in FIG. 2. The heat sink with angled fins 10 comprises a first set of fins 110 forming air channels represented generally by the numeral 113 and a second set of fins 140 forming air channels represented generally by the numeral 143. The first set of fins 110 includes fins represented generally by the numeral 111, and a fin panel base 330. The second set of fins 140 includes fins represented generally by the numeral 141 and the fin panel base 330. The second set of fins 140 are operably positioned with respect to the first set of fins 110 to convect air through the air channels 113 and 143 to a region 160 between the first set of fins 110 and the second set of fins 140. The first set of fins 110 includes fins 111 that protrude a height H (FIG. 1) from the fin panel base 330. The second set of fins 140 include fins 141 that protrude a height H from the fin panel base 330.

The heat sink with angled fins 10 also includes a heat sink base 170 that couples to the first set of fins 110 and the second set of fins 140. The heat sink base 170 is formed from a thermally conductive material, such as aluminum, or if higher thermal conductivity is required, copper. The first set of fins 110 and the second set of fins 140 are separated by a region 160 along a length of the heat sink base 170. The region 160 between the first set of fins 110 and the second set of fins 140 extends a length $L_{hsb}$ (FIG. 1) of the heat sink base 170. The fins 111 in the first set of fins 110 are at a first angle with respect to the length $L_{hsb}$ of the heat sink base 170 and the fins 143 in the second set of fins 140 are at a second angle with respect to the length of the heat sink base 170. In one implementation of this embodiment, the first angle is the angle $\theta_1$ subtended in a counter-clockwise (CCW) direction from the length $L_{hsb}$ (shown as arrow $L_1$ that is parallel to $L_{hsb}$) and the second angle is the angle $\theta_1$ subtended in a clockwise (CW) direction from the length $L_{hsb}$. In one implementation of this embodiment, the angle $\theta_1$ is 45 degrees. In another implementation of this embodiment, the angle $\theta_1$ is within a range of 35 degrees to 55 degrees.

The heat sink with angled fins 10 also includes a diversion fin 180. The diversion fin 180 is centrally positioned along the length $L_{hsb}$ of the heat sink base 170 between the first set of fins 110 and the second set of fins 140. The diversion fin 180 diverts the air convected through the air channels 113 and 143 in the first set of fins 110 and the second set of fins 140, respectively, away from the heat sink base 170. The diversion fin also prevents a cross wind from adversely effecting the cooling of the opposite side. For example, a wind blowing left to right will assist the left side's natural convection and increase the air velocity. However, without the diversion fin, that wind would continue to travel left to right across the assembly and hinder the natural convection of the right side fins by traveling in the opposite direction of the natural convection.

A solar shield 200 has openings 210 centrally positioned along a length $L_{ss}$ (FIG. 1) of the solar shield 200. The solar shield 200 overlays and is offset from the first set of fins 110 and second set of fins 140 overlaying the heat sink base 170. The convected air 315 that is directed by the diversion fin 180 flows through the openings 210. Solar shield standoffs 220 are positioned to hold the solar shield 200 an offset distance from the first set of fins 110 and the second set of fins 140. As shown in FIGS. 1 and 2, there are four solar shield standoffs 220 each positioned at a corner of the heat sink base 170.

The solar shield 200 keeps the fins 111 and 141 from the direct sunlight so they do not heat up from direct solar radiation. The solar shield 200 is offset from the fins 111 and 141 so that the heat from the sun that is absorbed by the solar shield 200 is not thermally conducted directly to the fins 111 and 141 in the heat sink with angled fins 10. The solar shield 200 can be made of any material, however the higher the reflectivity and the lower the thermal conductivity, the closer the solar shield 200 can be positioned to the fins 111 and 141. In situations where it is desired that the solar shield 200 is a dark color, the spacing above the fins 111 and 141 can be increased to limit the radiation absorbed by the solar shield 200 from heating the heat sink fins 111 and 141. In some cases, the solar shield standoffs 220 are made of a material having a low thermal conductivity, or a fastener and washer made of such material can be used to limit conduction from the shield to the heat sink.

The heat sink with angled fins 10 also includes at least one fin clamping bar 240 that has indents represented generally by the numeral 245 and holes represented generally by the numeral 246 (FIG. 1). Each indent 245 is formed to fit around an end 112 of a respective fin 111 in the first set of fins 110 or to fit around an end 142 of a respective fin 141 in the second set of fins 140. The fin clamping attachments represented generally by the numeral 250 fit in the holes 246 in the fin clamping bar 240. The fin clamping bars 240 and 241 fixedly attach the first set of fins 110 and the second set of fins 140, respectively, to the heat sink base 170 on the first side 171 and the second side 172 of the diversion fin 180, respectively, when the fin clamping attachments 250 are fixed to the heat sink base 170 through the holes 246 in the at fin clamping bars 240 and 241. As shown in FIG. 1, the fin clamping bar includes two fin clamping bars 240 and two fin clamping bars 241 and these four fin clamping bars 240 and 241 fixedly attach the first set of fins 110 and the second set of fins 140 to the heat sink base 170.

In one implementation of this embodiment, there is only one fin clamping bar that has a first opening through which the first set of fins 110 fits and a second opening through which the second set of fins 140 fit. In another implementation of this embodiment, there are two fin clamping bars that each has an opening through which the one set of fins 110 fits. The clamping bars illustrate a single method of securing the fins to the heat sink base. In one implementations of this embodiment, the fins are secured to the heat sink base by welding, bolting, riveting, bonding with adhesive or epoxy, mechanically press fitting, or staking.

The heat sink with angled fins 10 further includes a first thermal interface layer 230 and a second thermal interface layer 235 to transfer heat from the heat sink base 170 to the fin panel base 330 and on to the first set of fins 110 and the second set of fins 140. The first thermal interface layer 230 is positioned between the first set of fins 110 and the heat sink base 170 on a first side 171 of the diversion fin 180. The second thermal interface layer 235 is positioned between the second set of fins 140 and the heat sink base 170 on a second side 172 of the diversion fin 180. The thermal interfaces 230 and 240 are used to fill in any air gaps between the heat sink base 170 and the fin panel base 330 so that the heat is efficiently conducted from the heat sink base 170 via the fin panel base 330 to the fins 111 and 141.

The heat sink base 170, the first set of fins 110, and the set of fins 140 are formed from thermally conductive material, such as metals.

In one implementation of this embodiment, the thermal interface layers 230 and 240 are formed from graphite which conducts thermal energy. In another implementation of this embodiment, the thermal interface layers 230 and 240 are not included in the heat sink with angled fins 10. In yet another implementation of this embodiment, the heat sink base 170 has electronic components (not shown) attached to a far side (not visible in FIGS. 1 and 2).

Figures 3, 3C:
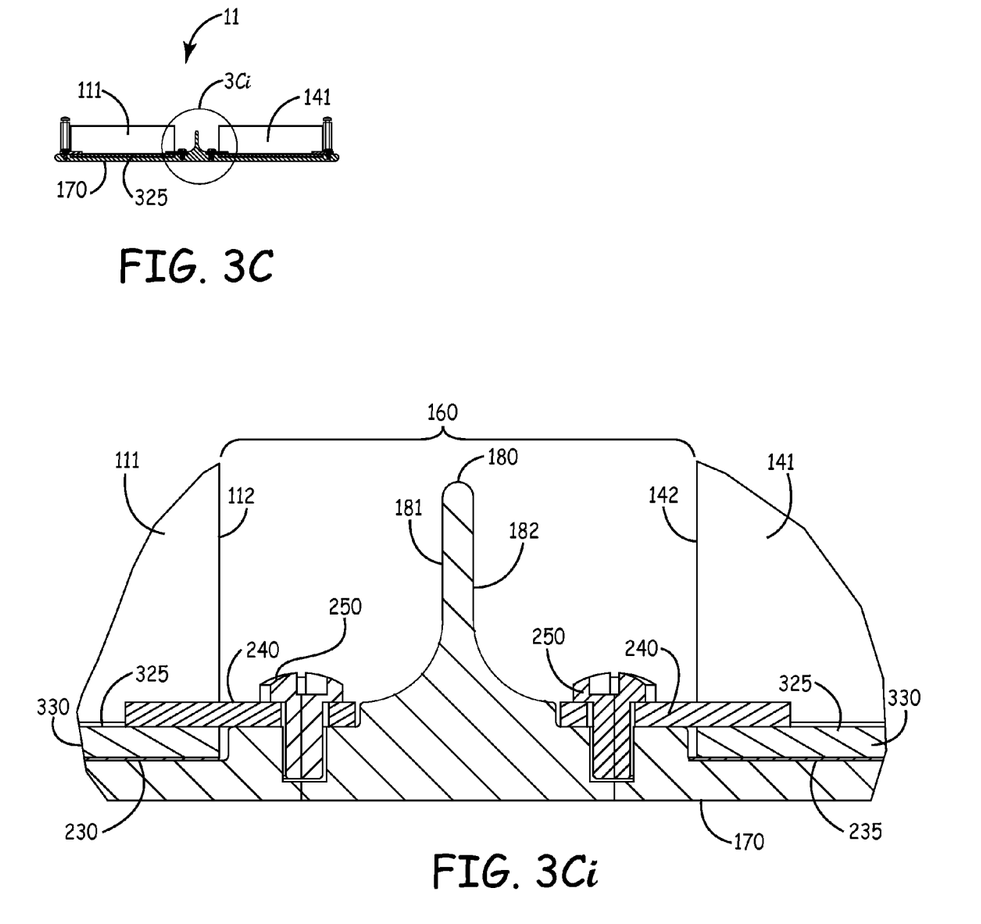
FIGS. 3A, 3B, 3C and 3ci are views of an embodiment of a heat sink with angled fins.
Figures 3A, 3B:
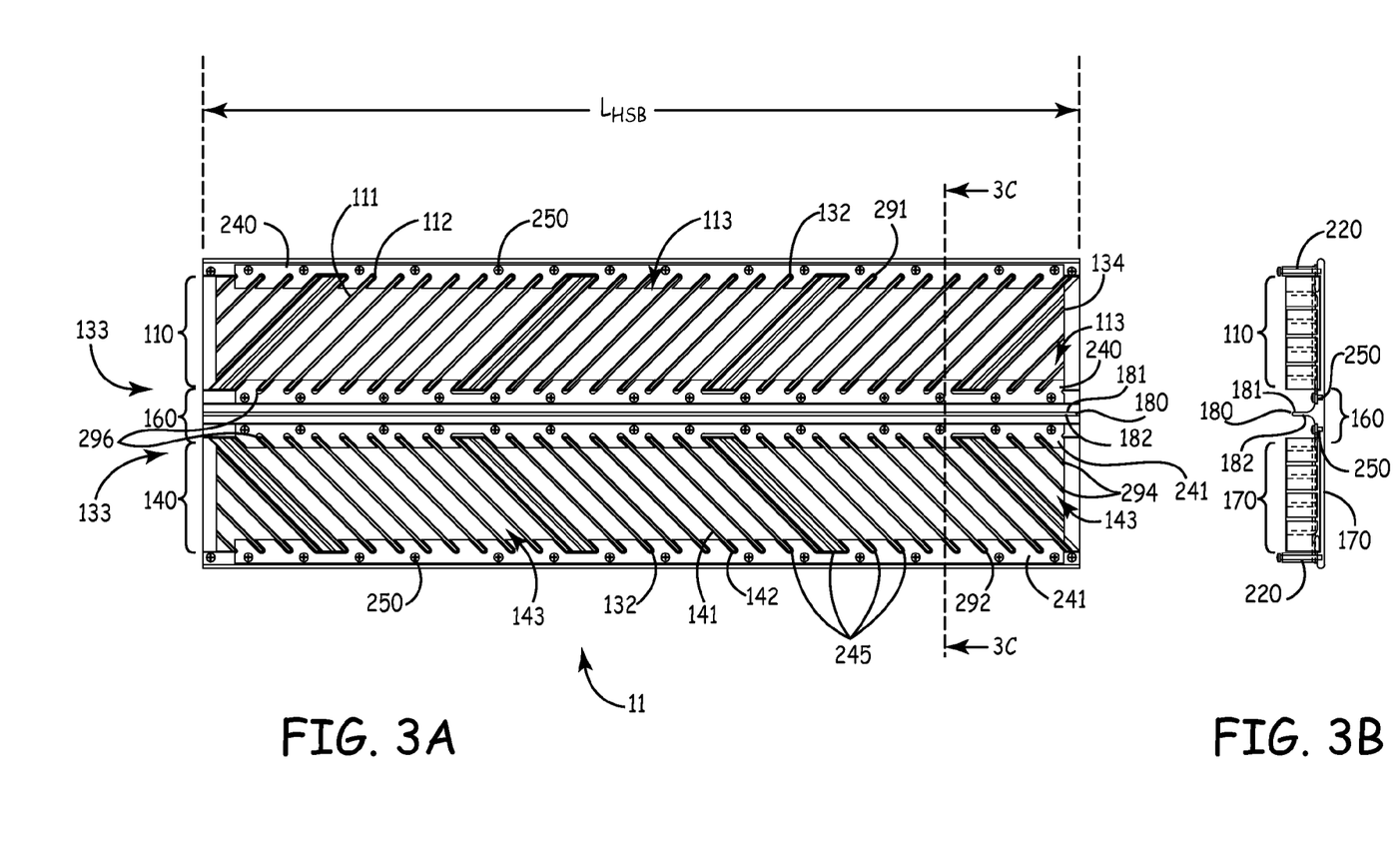

FIGS. 3A, 3B, 3C and 3ci are views of an embodiment of a heat sink with angled fins 11. The exemplary heat sink with angled fins 11 shown in FIGS. 3A, 3B, 3C and 3ci is the heat sink with angled fins 10 of FIGS. 1 and 2, without the solar shield 200. FIG. 3A is a top view of the heat sink with angled fins 11. FIG. 3B is a side view of edge 134 (FIG. 3A). FIG. 3C is a cross-sectional view of the heat sink with angled fins 11. The plane upon which the cross-section view of FIG. 3C is taken is indicated by section line 3C-3C in FIG. 3A. FIG. 3Ci is an enlarged view of the cross-sectional view of the diversion fin 180.

The first edges 132 (FIG. 3A) receive input air in the air channels 113 and 143. The edge 134 (FIG. 3A) is perpendicular to first edges 132. The edge 134 also receives input air in the air channels 113 and 143. One of the first edges 132 is the plane formed by the input edges represented generally by the numeral 291 of the fins 111 in the first set of fins 110. The other of the first edges 132 is the plane formed by the input edges represented generally by the numeral 292 of the fins 141 in the second set of fins 140. The edge 134 is the plane formed by the input edges represented generally by the numeral 294 (FIG. 4).

The heat sink with angled fins 11 includes second edges 133 opposing and parallel to the first edges 132. One of the second edges 133 is the plane formed by the output edges represented generally by the numeral 295 of the fins 111 in the first set of fins 110. The other of the second edges 133 is the plane formed by the output edges 296 of the fins 141 in the second set of fins 140.

As shown in FIG. 3Ci, the diversion fin 180 has a first surface 181 and a second surface 182 opposing the first surface 181. The air convected through the air channels 113 in the first set of fins 110 is directed away from the heat sink base 170 by the first surface 181. The air convected through the air channels 143 in the second set of fins 140 is directed away from the heat sink base 170 by the second surface 182.

Figure 4:
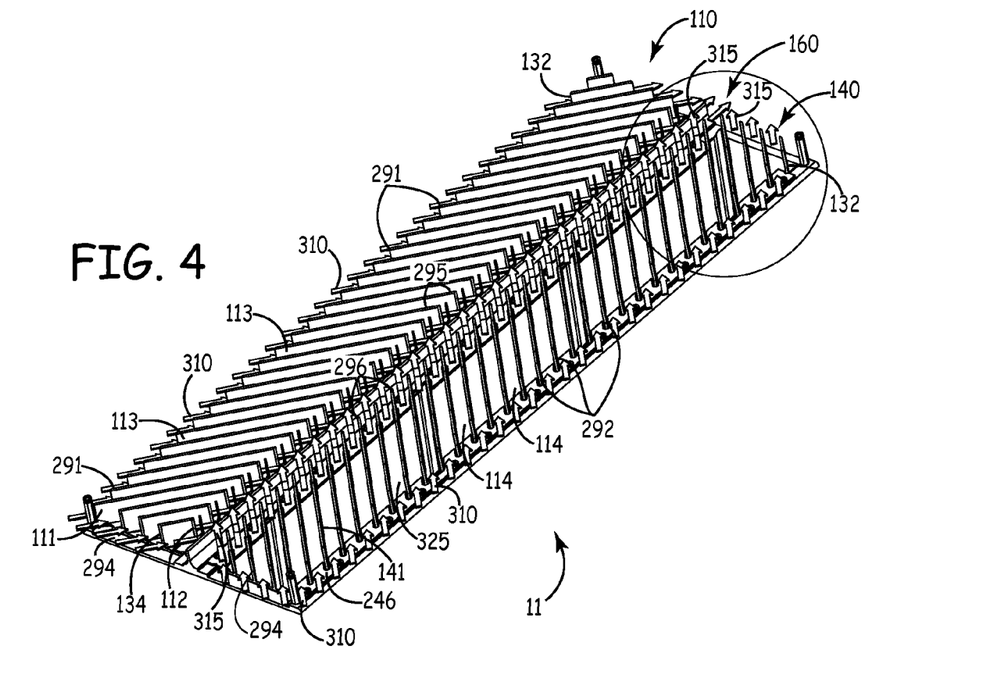
FIG. 4 is a view of one embodiment of a heat sink with angled fins showing air flow in air channels of the heat sink.
Figure 4I:
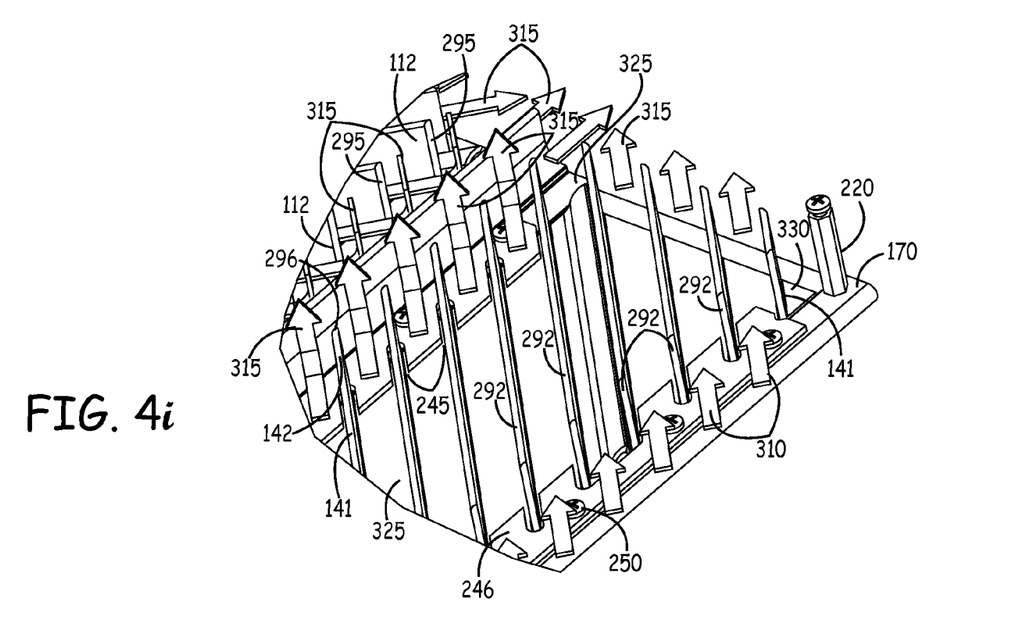
FIG. 4i is an enlarged view of a portion of one embodiment of the heat sink with angled fins of FIG. 4.

FIG. 4 is a view of one embodiment of a heat sink with angled fins 11 showing air flow in air channels 113 and 143. The air flow is diverted by a diversion fin 180. FIG. 4i is an enlarged view of a portion of one embodiment of the heat sink with angled fins 11 of FIG. 4. The first edges 132 (FIG. 3A) receive input air represented generally by the numeral 310 in the air channels 113 and 143.

As shown in FIG. 4, input air 310 transits the first edges 132 and the edge 134 and is convected through the air channels 113 and 143. As the air warms up in the air channels 113 and 143, it is convected in the air channels 113 and 143, and transits second edges 133 as it flows out of the air channels 113 and 143 as output air represented generally by the numeral 315. The output air 315 emitted from the air channels 113 and 143 is warmer than the input air 310.

The output air 315 convected through the air channels 113 in the first set of fins 110 is directed away from the surface 325 of the fin panel base 330 and the heat sink base 170 by the first surface 181 of the diversion fin 180. The output air 315 convected through the air channels 143 in the second set of fins 140 is directed away from the surface 325 of the fin panel base 330 and the heat sink base 170 by the second surface 182 of the diversion fin 180.

Figure 5A:
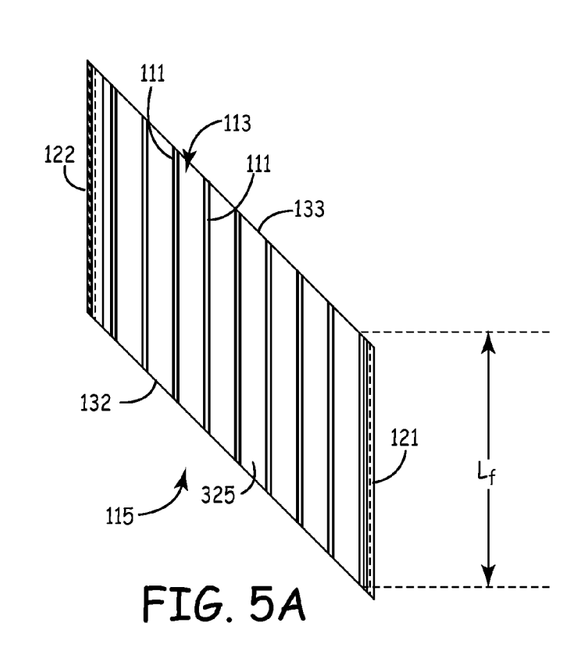
FIGS. 5A-5B are a top and end view, respectively, of one embodiment of an interlocking-parallelogram fin-section.
Figure 5B:
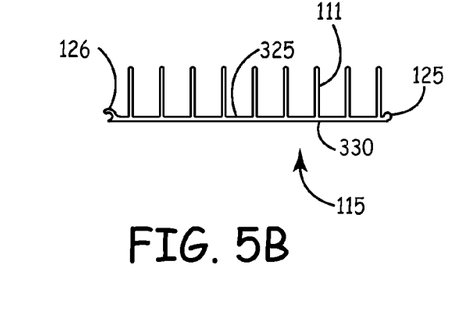

The first set of fins 110 includes a plurality of first interlocking fin-sections and the second set of fins 140 includes a plurality of second interlocking fin-sections. FIGS. 5A-5B are a top and end view, respectively, of one embodiment of an interlocking-parallelogram fin-section 115. As used herein, the terms interlocking-parallelogram fin-section 115, interlocking fin-section 115, and first interlocking fin-section 115 are used interchangeably. Likewise, as used herein, the terms interlocking-parallelogram fin-section 145, interlocking fin-section 145, and second interlocking fin-section 145 are used interchangeably.

Figure 6A:
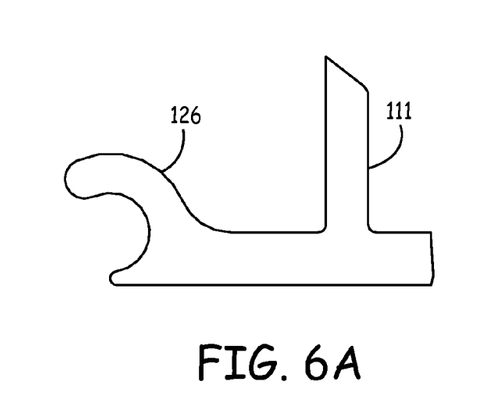
FIGS. 6A and 6B are enlarged views of one embodiment of a female interlocking feature and a male interlocking feature, respectively.
Figure 6B:
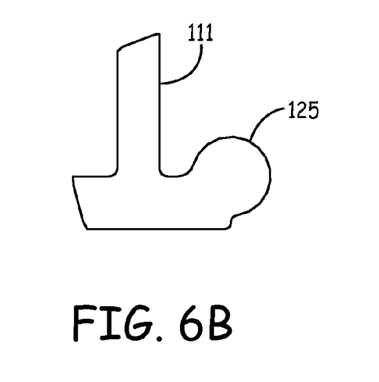

Each interlocking fin-section 115 and 145 has the shape of a parallelogram. Each interlocking fin-section includes a male edge 121 including a male interlocking feature 125 and a female edge 122 opposing and parallel to the male edge 121. The female edge 122 includes a female interlocking feature 126. FIGS. 6A and 6B are enlarged views of one embodiment of a female interlocking feature 126 and a male interlocking feature 125, respectively. The male edge 121 and the female edge 122 are parallel to a length $L_f$ of the fins. The shape of the parallelogram of the second interlocking fin-sections is the same as the shape of the parallelogram of the first interlocking fin-section 115 when the first interlocking fin-section 115 is flipped about a vertical axis running parallel to one of the fins.

The male interlocking feature 125 and the female interlocking feature 126 are designed to fit together. In one implementation of this embodiment, the male interlocking feature 125 and the female interlocking feature 126 snap together and are fixedly attached. In one implementation of this embodiment, male interlocking feature 125 and the female interlocking feature 126 are mated and then glued together with an adhesive or epoxy. In yet another implementation of this embodiment, male interlocking feature 125 and the female interlocking feature 126 slide together and then are held in place by the one or more fin clamping bars 240 when the fin clamping bars 240 are attached to the heat sink base 170 with fin clamping attachments 250. In one implementation of this embodiment, the fin clamping attachments 250 are screws that fit through the holes 246 in the one or more fin clamping bars 240 and are threaded into screw holes in the heat sink base 170.

Figure 7:
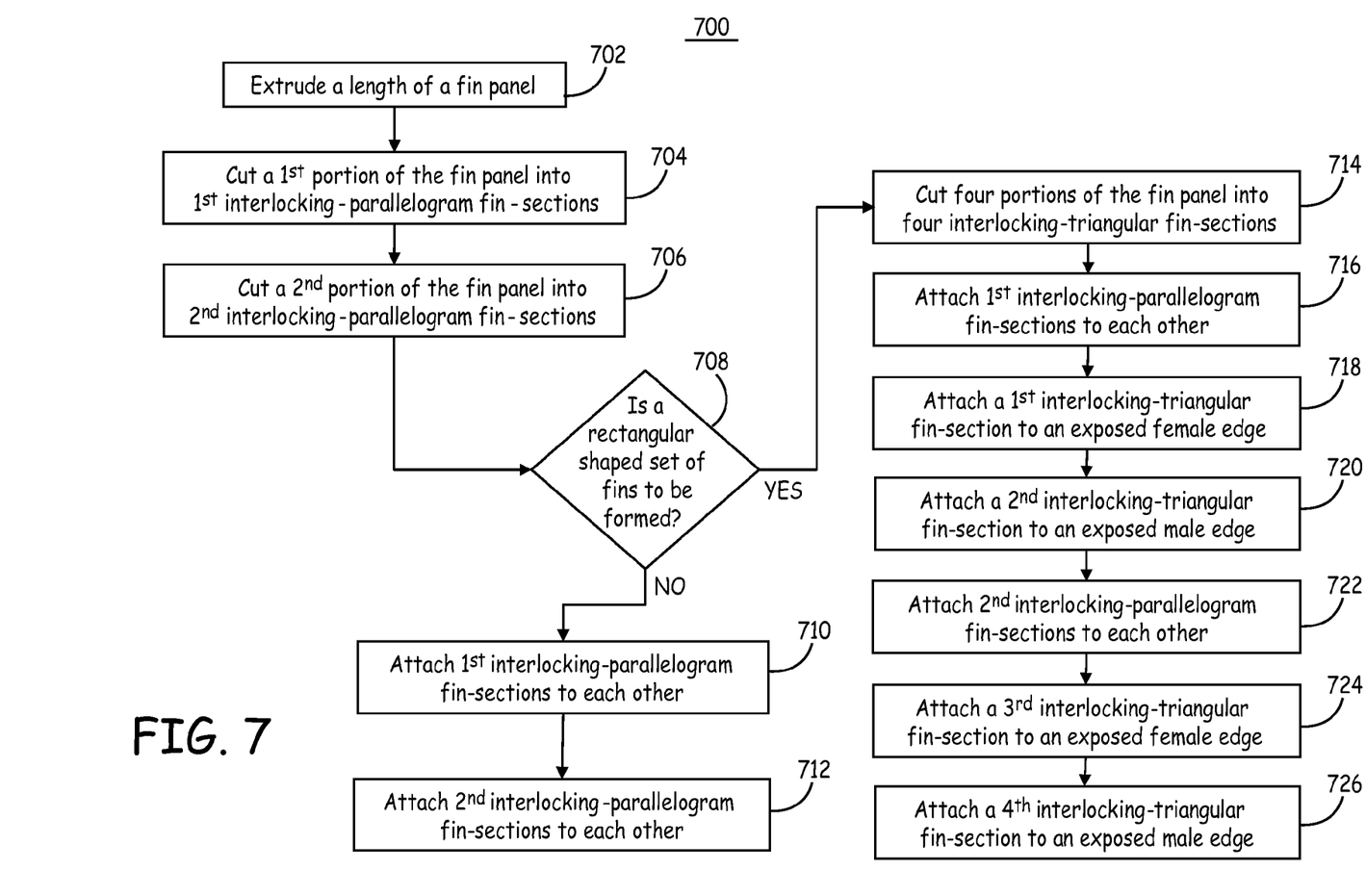
FIG. 7 is a flow diagram of one embodiment of a method of making a first set of fins and a second set of fins.

FIG. 7 is a flow diagram of one embodiment of a method 700 of making a first set of fins 110 and a second set of fins 140.

At block 702, a length of a fin panel is extruded. The fin panel includes fins extending from a third edge to a fourth edge in a direction that runs parallel to the extrusion of the fin panel. The fins protrude from a surface of a fin panel base by a height. The fin panel has a male edge including a male interlocking feature and a female edge opposing the male edge. The female edge includes a female interlocking feature. At block 704, a first portion of the fin panel is cut into first interlocking-parallelogram fin-sections. At block 706, a second portion of the fin panel is cut into second interlocking-parallelogram fin-sections. The first interlocking-parallelogram fin-sections and the second interlocking-parallelogram fin-sections are interconnected to form the heat sink with angled fins.

Figure 8A:
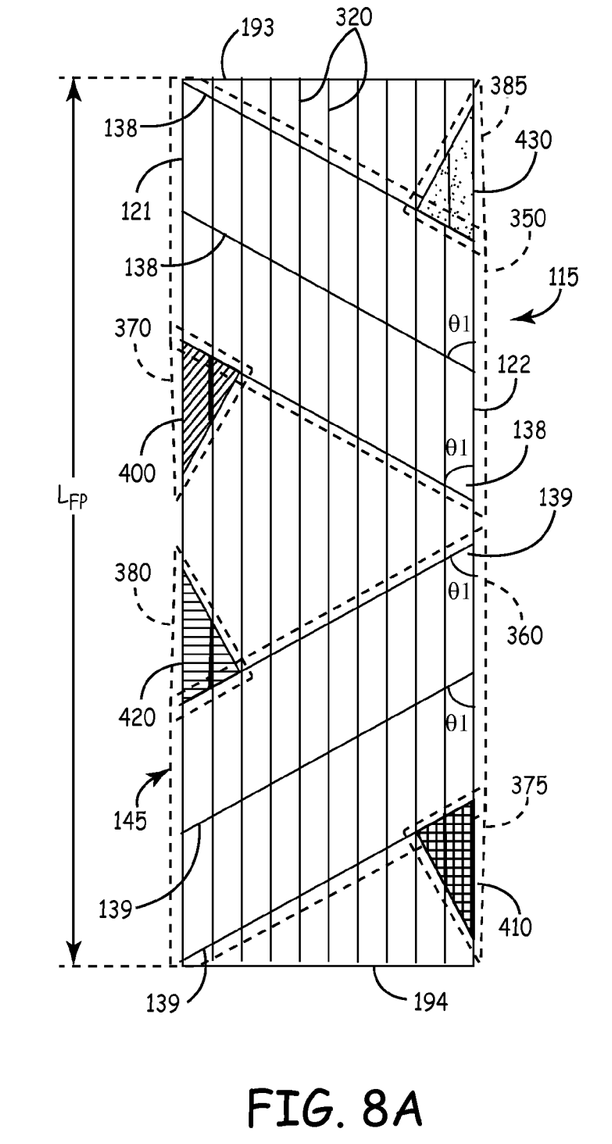
FIG. 8A is an exemplary configuration of a fin panel.

An exemplary method 700 for blocks 702-706 is now described with reference to FIGS. 8A-8C, 9, and 10A-10B. FIG. 8A is an exemplary configuration of a fin panel 300. The fin panel 300 includes portions 350, 360, 370, 375, 380, and 385. A length $L_{fp}$ of a fin panel 300 is extruded. In one implementation of this embodiment, the length $L_{fp}$ is several meters. The fin panel 300 includes fins 320 extending from a leading edge 193 to a trailing edge 194 in a direction that runs parallel to the extrusion of the fin panel 300. The fins 320 protrude from a surface 325 of a fin panel base 330 by a height H (FIG. 1). The fin panel 300 has a male edge 121 including a male interlocking feature 125 and a female edge 122 opposing the male edge 121. The female edge 122 includes a female interlocking feature 126.

The first portion 350 of the fin panel 300 is cut into first interlocking-parallelogram fin-sections 115. Cuts along the lines 138 in section 350 are required to form the first interlocking-parallelogram fin-sections 115. The second portion 360 of the fin panel 300 is cut into second interlocking-parallelogram fin-sections 145. Cuts along the lines 139 are required to form the second interlocking-parallelogram fin-sections 145.

Figure 8B:
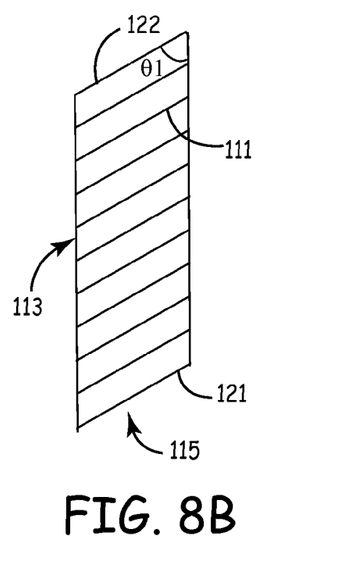
FIGS. 8B-8C are exemplary configurations of portions of a fin panel.

The first portion 350 of the fin panel 300 is cut into first interlocking fin-sections 115 by cutting from the female edge 122 to the male edge 121. The cut shown as line 138 intersects the female edge 122 further from the leading edge 193 than the cut intersects the male edge 121. As shown in FIG. 8A, the cut is at an angle of θ° from the female edge. In one implementation of this embodiment, the angle θ is 45 degrees. An exemplary first interlocking-parallelogram fin-section 115 shown in FIG. 8B is separated from the fin panel 300 after two cuts are made along the lines 138. The fins 320 (FIG. 8A) are represented as fins 111 in FIG. 8B. In one implementation of this embodiment, the fins 111 have a length of about six inches.

Figure 8C:
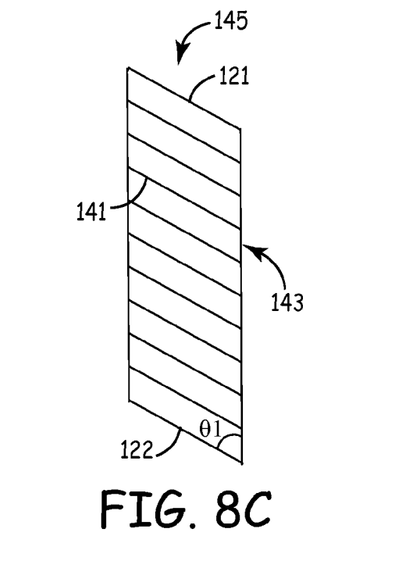

The second portion 360 of the fin panel 300 is cut into second interlocking fin-sections 145 by cutting from the female edge 122 to the male edge 121. The cut shown as line 139 intersects the female edge 122 closer to the leading edge 193 than the cut intersects the male edge 121. As shown in FIG. 8A, the cut is at an angle of (180−θ)° from the female edge, when measured in the same direction as the cut for the first interlocking fin-sections 115. FIGS. 8B-8C are exemplary configurations of portions of a fin panel 300. An exemplary second interlocking fin-section 145 shown in FIG. 8B is separated from the fin panel 300 after two cuts are made along the lines 139. The fins 320 (FIG. 8A) are represented as fins 111 in FIG. 8C. In one implementation of this embodiment, the fins 141 have a length of about six inches.

At block 708, it is determined if the set of fins is to be rectangularly shaped. If the set of fins is not to be rectangularly shaped the flow proceeds to block 710. At block 710, at least two first interlocking-parallelogram fin-sections are attached to each other to form a first set of fins having the shape of a parallelogram. At block 712, at least two second interlocking-parallelogram fin-sections are attached to each other to form a second set of fins having the shape of a parallelogram. Thus, at blocks 710 and 712, the first interlocking-parallelogram fin-sections and the second interlocking-parallelogram fin-sections are interconnected to form the heat sink with angled fins.

Figure 9:
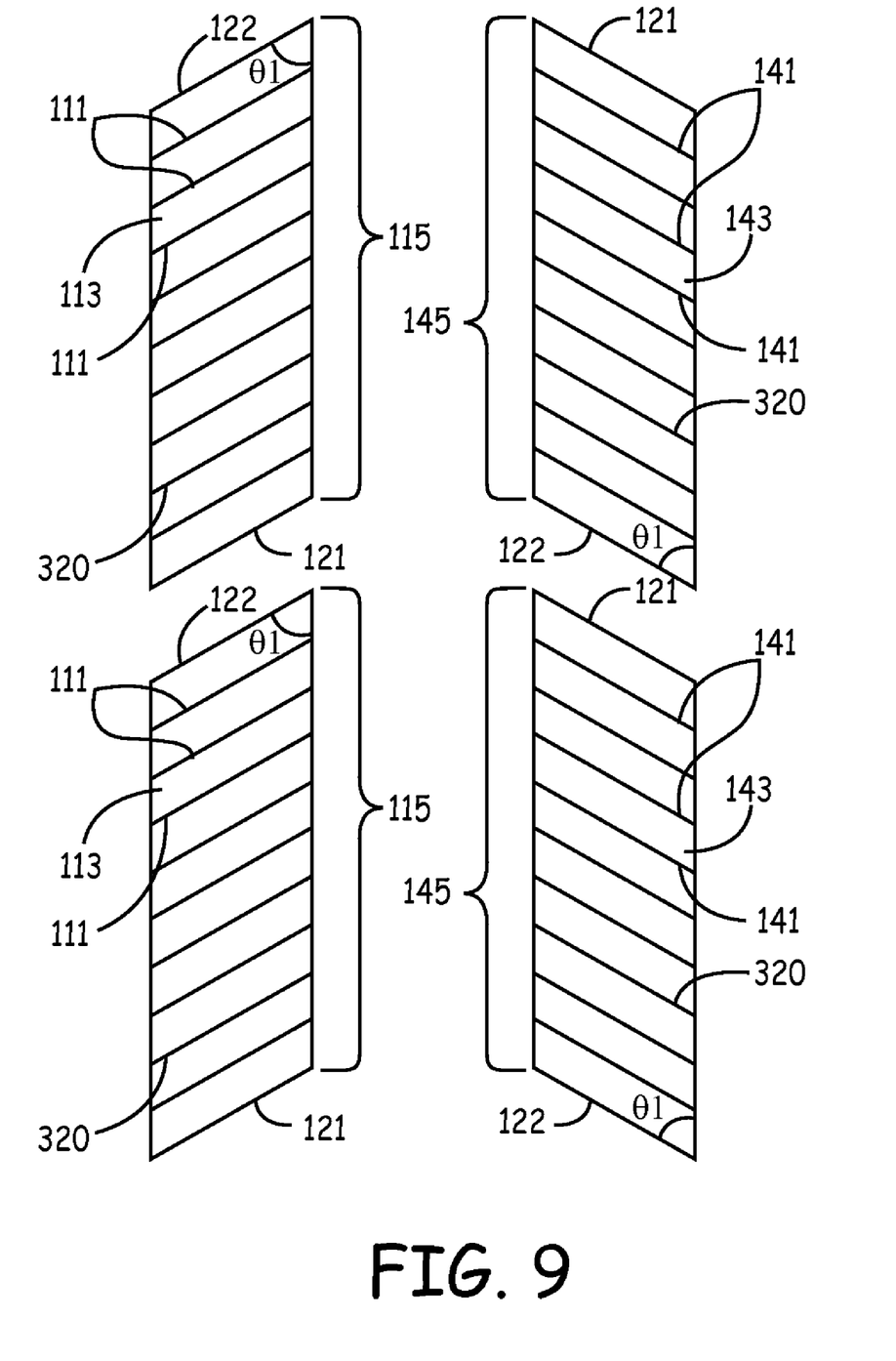
FIG. 9 is an exemplary configuration of four portions of the fin panel arranged for attachment.

FIG. 9 is an exemplary configuration of a four portions of the fin panel 300 arranged for attachment. Two first interlocking-parallelogram fin-sections 115 and two second interlocking-parallelogram fin-sections 145 are shown as separate pieces prior to implementation of blocks 710 and 712. Two first interlocking-parallelogram fin-sections 115 are a first set of fins and the two second interlocking-parallelogram fin-sections 145 are a second set of fins.

The fins 320 are parallel to the male edge 121 and the female edge 122. The female edge 122 at the top of one of the first interlocking-parallelogram fin-sections 115 is adjacent to the male edge 121 at the bottom of one of the first interlocking-parallelogram fin-sections 115. The male edge 121 at the top of one of the second interlocking-parallelogram fin-sections 145 is adjacent to the female edge at the bottom of the other one of the second interlocking-parallelogram fin-sections 145.

Figure 10A:
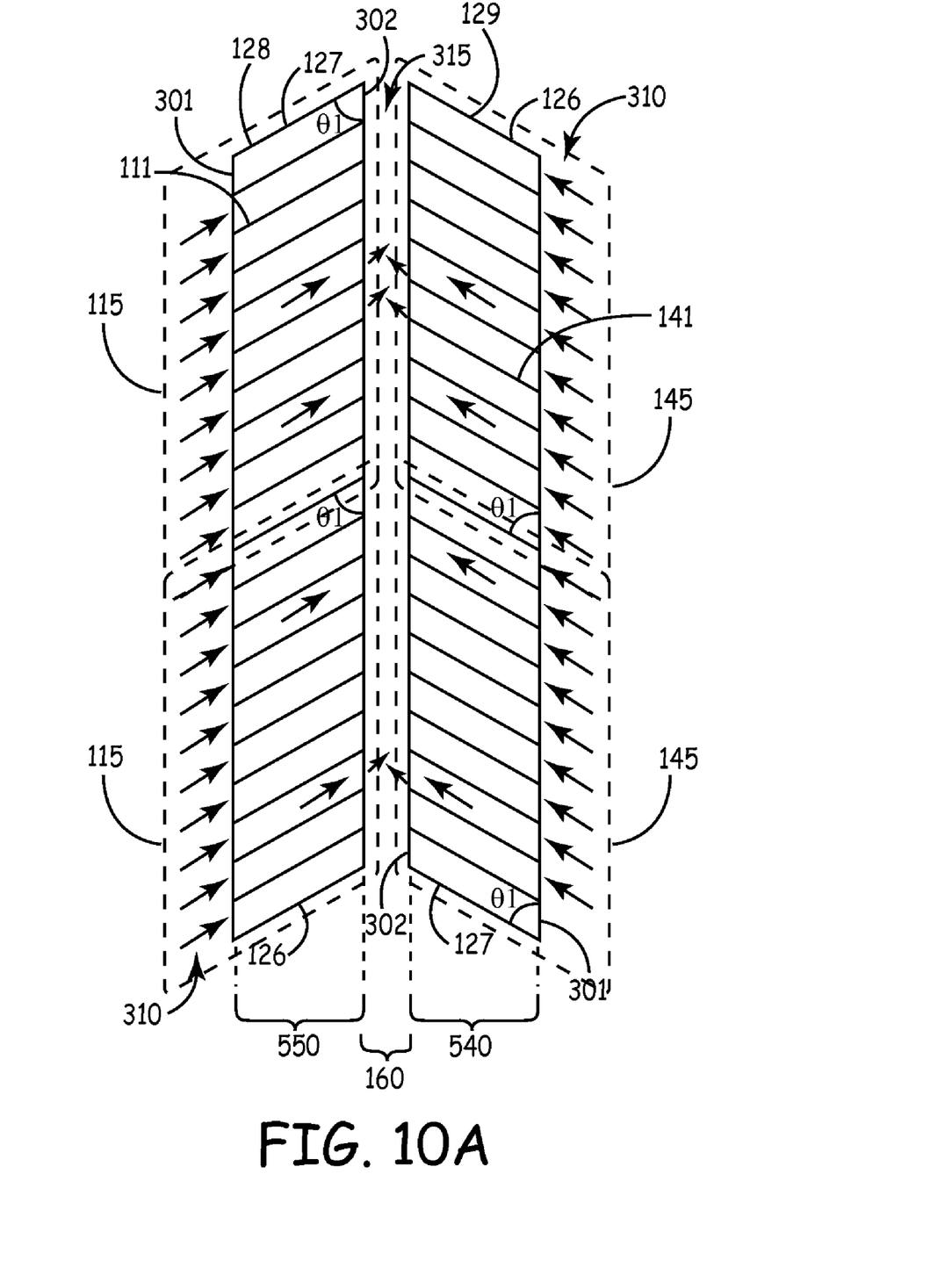
FIG. 10A is an exemplary configuration of the portions of the fin panel attached to form a first set of fins and a second set of fins each having the shape of a parallelogram.

FIG. 10A is an exemplary configuration of the portions of the fin panel attached to form a first set of fins 550 and a second set of fins 540 each having the shape of a parallelogram. As shown in FIG. 10A, the first interlocking fin-sections 115 and second interlocking fin-sections 145 that were cut from the fin panel 300 (FIG. 8) and arranged as in shown FIG. 9 are now shown after blocks 710 and 712 are implemented. The two first interlocking-parallelogram fin-sections 115 are attached to each other to form a first set of fins 550 and two second interlocking-parallelogram fin-sections 145 are attached to each other to form a second set of fins 540. As shown in FIG. 10A, the input air 310 is input to the input edge 301 of the first set of fins 550 and the input air 310 is also input to the input edge 301 of the second set of fins 540. The output air 315 is output from the output edge 302 of the first set of fins 550 and the output air 315 is also output from the output edge 302 of the second set of fins 540.

If at block 708 it is determined that the set of fins is to be rectangularly shaped, the flow proceeds to block 714. At block 714, four portions of the fin panel are cut into four interlocking-triangular fin-sections. Specifically, a third portion of the fin panel is cut is into first interlocking-triangular fin-sections, a fourth portion of the fin panel is cut into second interlocking-triangular fin-sections, a fifth portion of the fin panel is cut into third interlocking-triangular fin-sections and a sixth portion of the fin panel is cut into fourth interlocking-triangular fin-sections.

At block 716, at least two first interlocking-parallelogram fin-sections are attached to each other to form a first set of fins having the shape of a first parallelogram. The fins have a length parallel to a first end of the first parallelogram.

At block 718, a first interlocking-triangular fin-section is attached to an exposed female edge of the first set of fins having the shape of the first parallelogram. At block 720, a second interlocking-triangular fin-section is attached to an exposed male edge of the first set of fins having the shape of the first parallelogram. The first set of fins having the shape of a parallelogram, the first interlocking-triangular fin-section, and the second interlocking-triangular fin-section form a first set of fins having the shape of a rectangle.

At block 722, at least two second interlocking-parallelogram fin-sections are attached to each other to form a second set of fins having the shape of a second parallelogram. The fins have a length parallel to a first end of the second parallelogram. At block 724, the third interlocking-triangular fin-section is attached to an exposed female edge of the second set of fins having the shape of the second parallelogram.

At block 726, the fourth interlocking-triangular fin-section is attached to an exposed male edge of the second set of fins having the shape of the second parallelogram. The second set of fins having the shape of the second parallelogram, the third interlocking-triangular fin-section and the fourth interlocking-triangular fin-section form a second set of fins having the shape of a rectangle.

Figure 10B:
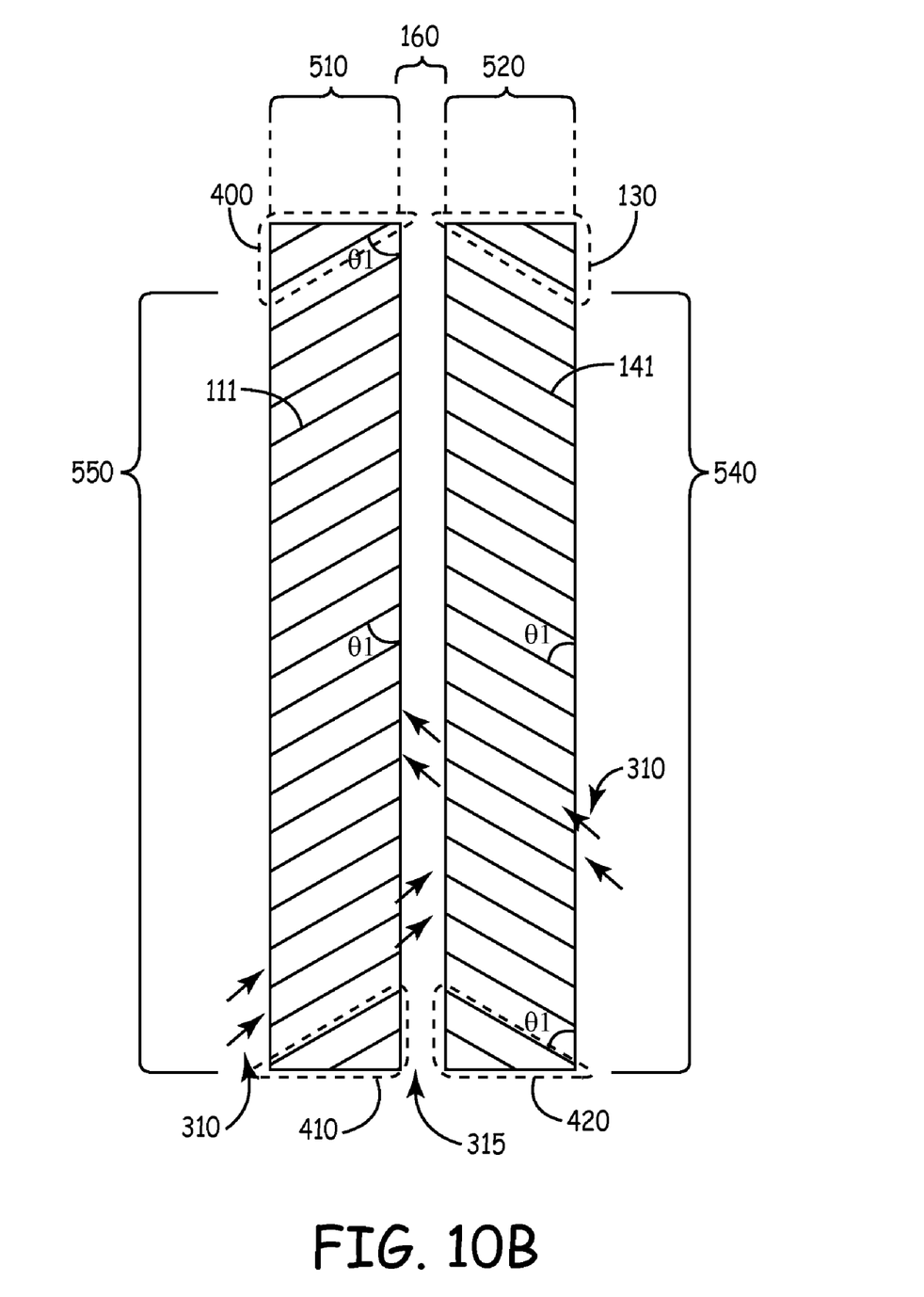
FIG. 10B is an exemplary configuration of the portions of the fin panel attached to form a first set of fins and a second set of fins each having the shape of a rectangle.

FIG. 10B is an exemplary configuration of the portions of the fin panel attached to form a first set of fins and a second set of fins each having the shape of a rectangle. As shown in FIG. 10B, the four portions 115 and 145 that were cut from the fin panel 300 (FIG. 8) and coupled as in shown FIG. 10A are now shown interlocked with interlocking-triangular fin-sections 400, 420, 420, and 430 after blocks 716-726 are implemented. The four portions 370, 375, 380, and 375 of the fin panel 300 are cut into four interlocking-triangular fin-sections 400, 420, 420, and 430, respectively. The at least two first interlocking-parallelogram fin-sections 115 are attached to each other to form a first set of fins 550 (FIG. 10A) having the shape of a first parallelogram. The fins 111 have a length parallel to a first end 127 of the first parallelogram 510 (FIG. 10A).

The first interlocking-triangular fin-section 400 is attached to an exposed female edge 127 (FIG. 10A) of the first set of fins 550 having the shape of the first parallelogram. A second interlocking-triangular fin-section 410 is attached to an exposed male edge 126 (FIG. 10A) of the first set of fins 510. The first set of fins 550 having the shape of the first parallelogram, the first interlocking-triangular fin-section 400, and the second interlocking-triangular fin-section 410 form a first set of fins 510 having the shape of a rectangle.

The at least two second interlocking-parallelogram fin-sections 145 are attached to each other to form a second set of fins 540 (FIG. 10A) having the shape of a second parallelogram. The fins 141 have a length parallel to a first end 129 of the second parallelogram. The third interlocking-triangular fin-section 420 is attached to an exposed female edge 127 (FIG. 10A) of the second set of fins 540 having the shape of the second parallelogram. The fourth interlocking-triangular fin-section 420 is attached to an exposed male edge 126 (FIG. 10A) of the second set of fins 540 having the shape of the second parallelogram. The second set of fins 540 having the shape of the second parallelogram, the third interlocking-triangular fin-section 420 and the fourth interlocking-triangular fin-section 430 form a second set of fins 520 having the shape of a rectangle.

Figure 11:
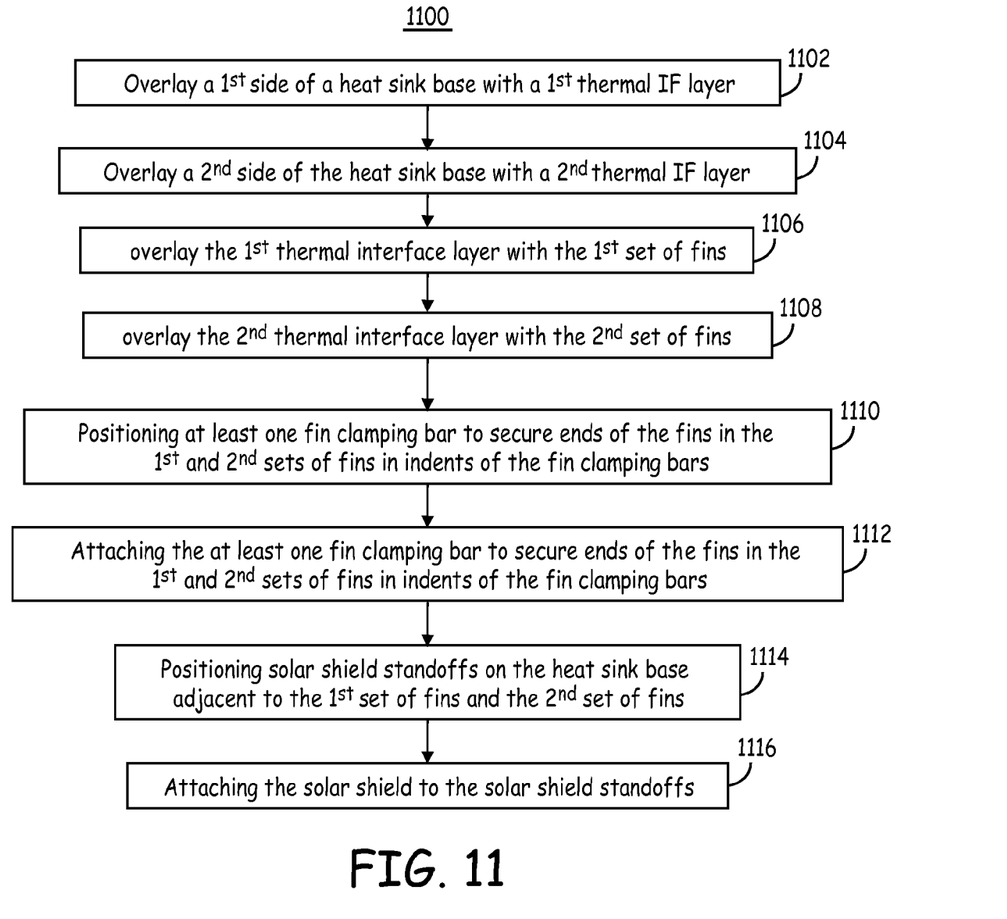
FIG. 11 is a flow diagram of one embodiment of a method to make a heat sink with angled fins.

FIG. 11 is a flow diagram of one embodiment of a method 1100 to make a heat sink with angled fins 10. At block 1102, a first side of a heat sink base overlays a first thermal interface layer. At block 1104, a second side of a heat sink base is overlaid with a second thermal interface layer.

At block 1106, the first thermal interface layer is overlaid with the first set of fins. In one implementation of this embodiment, the first thermal interface layer is overlaid with the first set of fins having the shape of a rectangle. In another implementation of this embodiment, the first thermal interface layer is overlaid with the first set of fins having the shape of a parallelogram.

At block 1108, the second thermal interface layer is overlaid with the second set of fins. In one implementation of this embodiment, the second thermal interface layer is overlaid with the second set of fins having the shape of a rectangle. In another implementation of this embodiment, the second thermal interface layer is overlaid with the second set of fins having the shape of a parallelogram.

At block 1110, at least one fin clamping bar is positioned to secure the ends of the fins in the first set of fins and the second set of fins in indents of the second fin clamping bars. In one implementation of this embodiment, there are four fin clamping bars, two fin clamping bar positioned with respect to the first set of fins and two fin clamping bar positioned with respect to the second set of fins. In another implementation of this embodiment, there are two fin clamping bar, one fin clamping bar positioned with respect to the first set of fins and another fin clamping bar positioned with respect to the second set of fins. In this case, the fin clamping bar is a frame that is configured to surround the set of fins. In yet another implementation of this embodiment, there is one fin clamping bar positioned with respect to the first set of fins the second set of fins. In this case, the fin clamping bar is a dual frame configured to simultaneously surround the first and second set of fins.

At block 1112, the at least one second fin clamping bar is attached to the heat sink base. At block 1114, the solar shield standoffs are positioned on the heat sink base adjacent to the first set of fins and the second set of fins. At block 1116, the solar shield is attached to the solar shield standoffs so that the solar shield is operably positioned. The solar shield opposes the heat sink base and is offset from the first set of fins and the second set of fins. Thus, when the solar shield is attached to the solar shield standoffs, the solar shield is operably positioned.

The method 1100 is now described with reference to the heat sink with angled fins 10 of FIGS. 1, 2, 10A and 10B. The first side 171 of a heat sink base 170 is overlaid with the first thermal interface layer 230. The second side 172 of a heat sink base 170 is overlaid with the second thermal interface layer 235. The first thermal interface layer 230 is overlaid with the first set of fins 510 (FIG. 10B) having the shape of a rectangle. In one implementation of this embodiment, the first thermal interface layer 230 is overlaid with the first set of fins 550 (FIG. 10A) having the shape of a parallelogram.

The second thermal interface layer 235 is overlaid with the second set of fins 520 (FIG. 10B) having the shape of a rectangle. In another implementation of this embodiment, second thermal interface layer 235 is overlaid with the second set of fins 540 (FIG. 10A) having the shape of a parallelogram.

At least one first fin clamping bar 240 is positioned to secure the ends 112 of the fins 111 in the first set of fins 110 in indents 245 of the at least one first fin clamping bar 240 (FIG. 1). In another implementation of this embodiment, a second fin clamping bar 241 is positioned to secure the ends 142 of the fins 141 in the second set of fins 140 in indents 245 of the second fin clamping bar 241. The first and second fin clamping bars 240 and 241 are attached to the heat sink base 170.

Solar shield standoffs 220 are operably positioned on the heat sink base 170 adjacent to the first set of fins 110 and the second set of fins 140 and the solar shield 200 is attached to the solar shield standoffs 220 so the solar shield 200 overlays and is offset from the first set of fins 110 and the second set of fins 140.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A heat sink with angled fins comprising:
    a first set of fins forming air channels;
    a second set of fins forming air channels;
    a heat sink base having a surface forming a plane coupled to the first set of fins and the second set of fins, wherein the first set of fins and the second set of fins are separated by a region along a length of the heat sink base, and wherein the fins in the first set of fins are perpendicular to the plane of the heat sink base and are positioned along the length of the heat sink base at a first acute angle with respect to the length of the heat sink base, and wherein the fins in the second set of fins are perpendicular to the plane of the heat sink base and are positioned along the length of the heat sink base at a second acute angle with respect to the length of the heat sink base; and
    a diversion fin centrally positioned along the length of the heat sink base between the first set of fins and the second set of fins, the diversion fin configured to divert the air convected through the air channels in the first set of fins and the second set of fins away from the heat sink base, the diversion fin having a first surface and a second surface opposing the first surface, wherein air convected through the air channels in the first set of fins is directed away from the heat sink base by the first surface and air convected through the air channels in the second set of fins is directed away from the heat sink base by the second surface.

2. The heat sink with angled fins of claim 1, further comprising:
    a solar shield having openings centrally positioned along a length of the solar shield, wherein the solar shield overlays and is offset from the first set of fins and second set of fins overlaying the heat sink base, wherein the directed convected air flows through the openings.

3. The heat sink with angled fins of claim 2, further comprising:
    solar shield standoffs operably positioned to hold the solar shield an offset distance from the first set of fins and the second set of fins.

4. The heat sink with angled fins of claim 1, further comprising:
    a first thermal interface layer to transfer heat, the first thermal interface layer operably positioned between the first set of fins and the heat sink base on a first side of the diversion fin; and
    a second thermal interface layer to transfer heat, the second thermal interface layer operably positioned between the second set of fins and the heat sink base on a second side of the diversion fin.

5. The heat sink with angled fins of claim 1, further comprising:
    at least one fin clamping bar having indents and holes, each indent formed to fit around an end of a respective fin in one of the first set of fins and the second set of fins; and
    fin clamping attachments to fit in the holes in the at least one fin clamping bar, wherein the at least one fin clamping bar fixedly attaches the first set of fins and the second set of fins to the heat sink base on the first side and the second side of the diversion fin, respectively, when the fin clamping attachments are fixed to the heat sink base through the holes in the at least one fin clamping bar.

6. A heat sink with angled fins, comprising:
    a first set of fins forming air channels, the first set of fins including a plurality of first interlocking fin-sections;
    a second set of fins forming air channels, the second set of fins including a plurality of second interlocking fin-sections, each interlocking fin-section having the shape of a parallelogram, and each interlocking fin-section comprising:
        a male edge including a male interlocking feature; and
        a female edge opposing and parallel to the male edge, the female edge including a female interlocking feature, the male edge and the female edge parallel to a length of the fins, the heat sink further comprising:
    a heat sink base having a surface forming a plane coupled to the first set of fins and the second set of fins, wherein the first set of fins and the second set of fins are separated by a region along a length of the heat sink base, and wherein the fins in the first set of fins are perpendicular to the plane of the heat sink base and are positioned along the length of the heat sink base at a first acute angle with respect to the length of the heat sink base, and wherein the fins in the second set of fins are perpendicular to the plane of the heat sink base and are positioned along the length of the heat sink base at a second acute angle with respect to the length of the heat sink base.

7. A heat sink with angled fins comprising:
    interlocking fin-sections comprising thermally conductive fins protruding from a thermally conductive fin base,
    wherein a first set of interlocking fin-sections are operably attached to each other to form a first set of fins in which a first fin base has the shape of a first non-rectangular parallelogram, the fins of the first set of fins extending a length that is parallel to a shorter edge of the first non-rectangular parallelogram, and
    wherein a second set of interlocking fin-sections are operably attached to each other to form a second set of fins in which a second fin base has the shape of a second non-rectangular parallelogram, the fins of the second set of fins extending a length that is parallel to a shorter edge of the second non-rectangular parallelogram;
    a heat sink base coupled to the first set of fins and the second set of fins;
    a diversion fin centrally positioned along a length of the heat sink base to segment the heat sink base into a first side and a second side, the first side operable to support the first set of fins and the second side operable to support the second set of fins, the diversion fin configured to divert air convected between the fins away from the heat sink base.

8. The heat sink with angled fins of claim 7, the diversion fin further comprising:
    a first surface; and
    a second surface opposing the first surface, wherein air convected by the first set of fins is directed away from the heat sink base by the first surface and air convected by the second set of fins is directed away from the heat sink base by the second surface.

9. The heat sink with angled fins of claim 8, further comprising:
   a solar shield having openings centrally positioned along a length of the solar shield, wherein the solar shield overlays and is offset from the first and second set of fins overlaying the heat sink base, wherein the convected air directed away from the heat sink base by the diversion fin flows through the openings; and
   solar shield standoffs operably positioned to hold the solar shield an offset distance from the first set of fins and the second set of fins.

10. The heat sink with angled fins of claim 7, further comprising:
   a first thermal interface layer operably positioned between the first set of fins and the first side of the heat sink base; and
   a second thermal interface layer operably positioned between the second set of fins and the second side of the heat sink base.

11. The heat sink with angled fins of claim 7, further comprising:
   fin clamping bars having indents and holes, each indent formed to fit around an end of a respective fin in one of the first set of fins and the second set of fins; and
   fin clamping attachments to fit in the holes in the fin clamping bars, wherein the fin clamping bars fixedly attach the first set of fins and the second set of fins to the first side and the second side, respectively, of the diversion fin in the heat sink base when the fin clamping attachments are fixed to the heat sink base through the holes in the fin clamping bars.

12. The heat sink with angled fins of claim 7, wherein the interlocking fin-sections comprise a set of first interlocking fin-sections and a set of second interlocking fin-sections, each interlocking fin-section having the shape of a parallelogram, and each interlocking fin-section comprising:
   a male edge including a male interlocking feature;
   a female edge opposing and parallel to the male edge, the female edge including a female interlocking feature, the male edge and the female edge parallel to a length of the fins;
   a first edge to receive input air in the air channels formed by neighboring fins; and
   a second edge opposing and parallel to the first edge wherein output air emitted from the air channels is warmer than the input air.

* * * * *